(12) United States Patent
Nagakubo et al.

(10) Patent No.: US 7,879,150 B2
(45) Date of Patent: Feb. 1, 2011

(54) SILICON CARBIDE MANUFACTURING DEVICE AND METHOD OF MANUFACTURING SILICON CARBIDE

(75) Inventors: Masao Nagakubo, Nishikamo-gun (JP); Fusao Hirose, Obu (JP); Yasuo Kitoh, Okazaki (JP)

(73) Assignee: DENSO CORPORATION, Kariya (JP)

( * ) Notice: Subject to any disclaimer, the term of this patent is extended or adjusted under 35 U.S.C. 154(b) by 425 days.

(21) Appl. No.: 11/896,504

(22) Filed: Sep. 4, 2007

(65) Prior Publication Data

US 2008/0053371 A1 Mar. 6, 2008

(30) Foreign Application Priority Data

Sep. 6, 2006 (JP) .............................. 2006-241642

(51) Int. Cl.
*C23C 16/00* (2006.01)
(52) U.S. Cl. .................... 118/715; 117/200; 117/84; 117/88; 117/951
(58) Field of Classification Search ................ 117/200, 117/84, 88, 951; 118/715
See application file for complete search history.

(56) References Cited

U.S. PATENT DOCUMENTS

| | | | | |
|---|---|---|---|---|
| 4,500,492 | A | * | 2/1985 | Yamakawa ................... 422/199 |
| 6,039,812 | A | * | 3/2000 | Ellison et al. ............... 118/725 |
| 6,656,284 | B1 | | 12/2003 | Hwang et al. |

FOREIGN PATENT DOCUMENTS

| | | |
|---|---|---|
| JP | A-9-087320 | 3/1997 |
| JP | A-2000-241077 | 9/2000 |
| JP | A-2000-354753 | 12/2000 |
| JP | A-2001-35795 | 2/2001 |
| JP | A-2001-284264 | 10/2001 |
| JP | A-2003-002795 | 1/2003 |
| JP | A-2003-137697 | 5/2003 |
| WO | WO 98/14643 | 4/1998 |

OTHER PUBLICATIONS

Search Report issued Apr. 21, 2009 from European Patent Office in the corresponding European Patent Application No. 07115627.7-1215.
Office Action dated Sep. 14, 2010 from Japanese Patent Office in corresponding Japanese Patent Application No. 2006-241642 (and English Translation).

* cited by examiner

*Primary Examiner*—Matthew J Song
(74) *Attorney, Agent, or Firm*—Posz Law Group, PLC

(57) ABSTRACT

A silicon carbide manufacturing device includes a graphite crucible, in which a seed crystal is disposed, a gas-inducing pipe coupled with the graphite crucible, and an attachment prevention apparatus. The gas-inducing pipe has a column-shaped hollow part, through which a source gas flows into the graphite crucible. The attachment prevention apparatus includes a rod extending to a flow direction of the source gas, and a revolving and rotating element for revolving the rod along an inner wall of the gas-inducing pipe while rotating the rod on an axis of the rod in parallel to the flow direction.

17 Claims, 7 Drawing Sheets

SOURCE GAS

SILICON CARBIDE MANUFACTURING DEVICE AND METHOD OF MANUFACTURING SILICON CARBIDE

CROSS REFERENCE TO RELATED APPLICATION

This application is based on Japanese Patent Application No. 2006-241642 filed on Sep. 6, 2006, the contents of which is incorporated herein by reference in its entirety.

BACKGROUND OF THE INVENTION

1. Field of the Invention

The present invention relates to a silicon carbide manufacturing device and a method of manufacturing silicon carbide.

2. Description of the Related Art

Conventionally, a silicon carbide (SiC) manufacturing device using a gas growth method has a graphite crucible and a seed crystal disposed in the graphite crucible. A source gas of SiC is induced in the graphite crucible so that a SiC crystal grows on a surface of the seed crystal.

For example, a seed crystal J2 is disposed on an upper surface of a cylindrical graphite crucible J1, a gas-inducing pipe J3 is connected to a lower surface of the graphite crucible J1, and the source gas is induced in the graphite crucible J1 through the gas-inducing pipe J3, as shown in FIG. 7. Here, a mixed gas of silane ($SiH_4$) and propane ($C_3H_8$) is induced as the source gas in a state where the graphite crucible J1 is heated at about 2300° C. Thereby, a SiC single crystal grows on a surface of the seed crystal J2.

The SiC manufacturing device using the gas growth method has an advantage that the source gas can be supplied for a long time. However, this SiC manufacturing device has a problem that a source material in the source gas decomposes and reacts in a temperature zone in the gas-inducing pipe J3, thereby a powder-shaped deposit (i.e., reactive deposit) J4 attaches to an inner wall of the gas-inducing pipe J3. Thus, in a case where a supplying time of the source gas becomes long, the gas-inducing pipe J3 may be clogged with the reactive deposit J4, thereby the SiC crystal may not grow, and the advantage of the gas growth method may be reduced.

For example, WO9814643 (corresponding to JP 2001-501161 A) discloses a SiC manufacturing device, in which a gas-inducing pipe has a double pipe structure. A source gas is induced from an inner pipe, and a carrier gas such as argon and helium is induced between an outer pipe and the inner pipe. Thereby, the source gas is restricted from attaching to an inner wall of the gas-inducing pipe, and a reactive deposit is restricted from growing on the inner wall of the gas-inducing pipe.

In this SiC manufacturing device, a cluster-shaped reactive deposit may be formed, and may move toward the inner wall of the gas-inducing pipe across the carrier gas. As a result, this SiC manufacturing device cannot prevent the above-described problem.

Alternatively, JP 2001-35795 A discloses a vapor-phase growth device having a scratching blade for removing a clogging on a side of an exhaust pipe, i.e., at a downstream of a portion where a vapor-phase growth is performed. Specifically, the scratching blade is attached to a rotating shaft arranged in a center portion of the exhaust pipe, and is rotated to mechanically remove the reactive deposit clogging the exhaust pipe.

In this vapor-phase growth device, the reactive deposit may attach to the scratching blade, thereby a clogging of the exhaust pipe may occur, eventually. In addition, a clogging may occur at an upstream of the portion where the vapor-phase growth is performed. In a case where the scratching blade is disposed at the upstream, when a reactive deposit attached to the scratching blade falls due to its own weight, a large amount of powder dust may soar, and may reduce a quality of the vapor-phase growth performed at a downstream of the scratching blade. Thus, this vapor-phase growth device is required to prevent a clogging of the gas-inducing pipe while preventing an attachment of the reactive deposit on the scratching blade.

SUMMARY OF THE INVENTION

It is therefore an object of the present invention to provide a SiC manufacturing device which prevents a clogging of a gas-inducing pipe with a reactive deposit and manufactures a SiC single crystal with a high quality without an effect of removing the reactive deposit.

According to an aspect of the invention, a SiC manufacturing device includes a graphite crucible, in which a seed crystal is disposed, a gas-inducing pipe coupled with the graphite crucible, and an attachment prevention apparatus. The gas-inducing pipe has a column-shaped hollow part, through which a source gas flows into the graphite crucible. The attachment prevention apparatus includes a rod extending to a flow direction of the source gas, and a revolving and rotating element for revolving the rod along an inner wall of the gas-inducing pipe while rotating the rod on an axis of the rod in parallel to the flow direction.

In this SiC manufacturing device, the rod revolves at the position where the reactive deposit generates. Therefore, the rod drops off the reactive deposit before growing up or restricts the reactive deposit from growing. In addition, the rod rotates on its axis, thereby the reactive deposit is restricted from attaching to the rod. Thus, the gas-inducing pipe is prevented from being clogged with the reactive deposit, and the source gas can be induced for a long time, i.e., the SiC single crystal can grow to be long. Furthermore, this SiC manufacturing device restricts the removed reactive deposit from reducing the quality of the growing crystal.

According to another aspect of the invention, a method of manufacturing silicon carbide is provided. The method includes a step of disposing a seed crystal in a graphite crucible, a step of inducing a source gas from a gas-inducing pipe to the graphite crucible, and a step of revolving a rod along an inner wall of the gas-inducing pipe while rotating the rod on an axis of the rod in parallel to the flow direction.

In this method, the rod revolves at the position where the reactive deposit generates. Therefore, the rod drops off the reactive deposit before growing up or restricts the reactive deposit from growing. In addition, the rod rotates on its axis, thereby the reactive deposit is restricted from attaching to the rod. Thus, similar effects with those of the above-described SiC manufacturing device can be obtained.

BRIEF DESCRIPTION OF THE DRAWINGS

Additional objects and advantages of the present invention will be more readily apparent from the following detailed description of preferred embodiments when taken together with the accompanying drawings. In the drawings.

DETAILED DESCRIPTION OF THE PREFERRED EMBODIMENTS

First Embodiment

Figure 1:
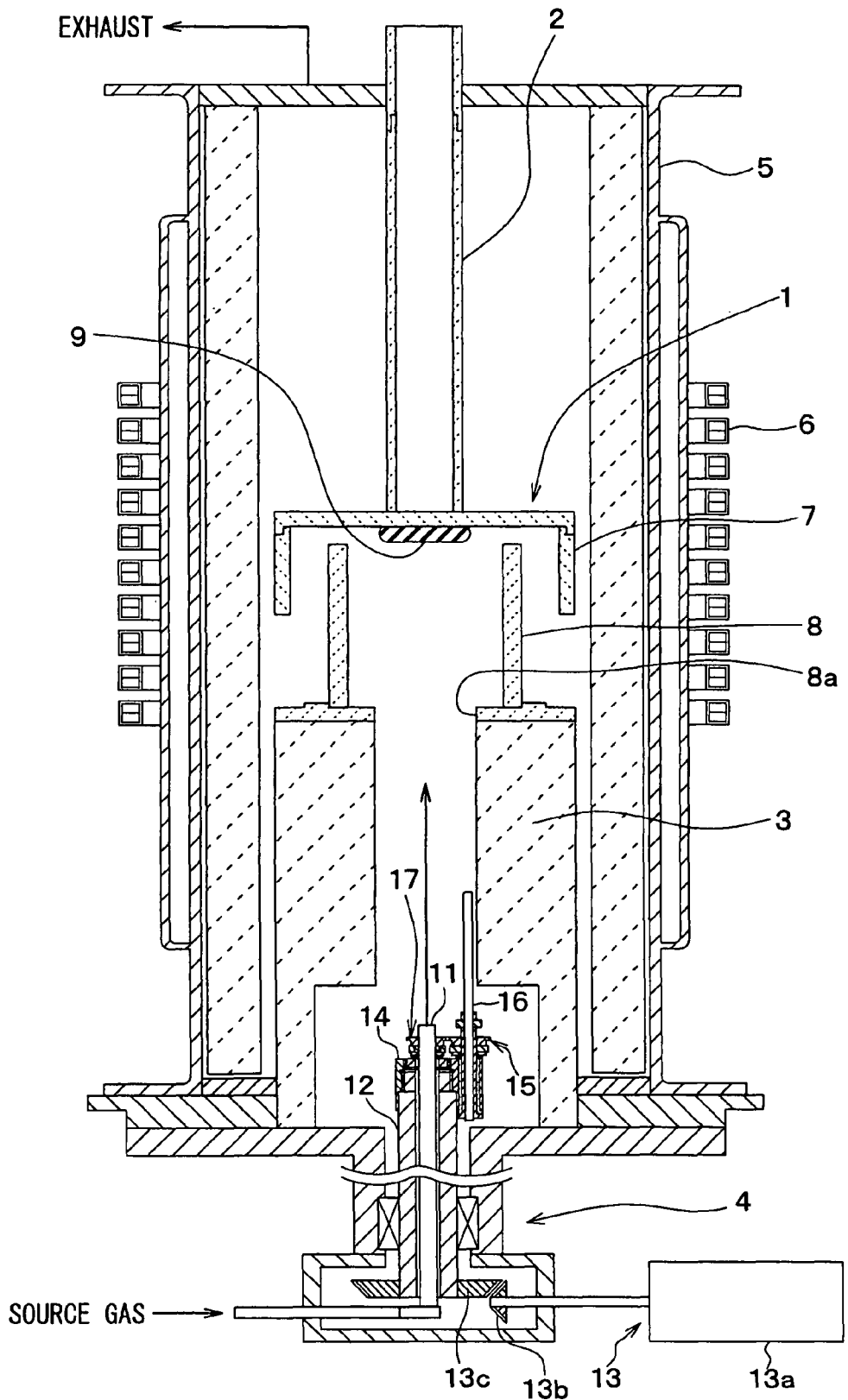
FIG. 1 is a cross-sectional view of a SiC manufacturing device according to a first embodiment of the invention.

A SiC manufacturing device in FIG. 1 includes a graphite crucible 1, a lifting member 2, a gas-inducing pipe 3, an attachment prevention apparatus 4, a chamber 5, and an induction coil 6, for example.

The graphite crucible 1 includes an upper crucible part 7 and a lower crucible part 8. The upper crucible part 7 is formed into a cylindrical shape with a bottom. The lower crucible part 8 is formed into a cylindrical shape having a gas-inducing hole 8a. An inside diameter of the upper crucible part 7 is set to be longer than an outside diameter of the lower crucible part 8, so that an inner wall of the upper crucible part 7 and an outer wall of the lower crucible part 8 have a clearance therebetween, and a source gas is exhausted through the clearance. A seed crystal 9 made of a SiC single crystal is attached on an inner surface of the bottom of the upper crucible part 7 so that a SiC single crystal grows on a surface of the seed crystal 9. The lifting member 2 is attached at an approximately center portion of an outer surface of the bottom of the upper crucible part 7 for lifting the upper crucible part 7 so that a growing surface of the SiC single crystal is located at an predetermined position.

The gas-inducing pipe 3 has a cylindrical shape and is made of a thermal insulation material. The gas-inducing pipe 3 is coupled with the lower crucible part 8 so that the source gas is induced into the gas-inducing hole 8a through the gas-inducing pipe 3. For example, the gas-inducing pipe 3 has an inside diameter about 60 mm, from a coupled part with the lower crucible part 8 to a predetermined portion. In addition, the gas-inducing pipe 3 has a longer diameter at a portion accommodating the attachment prevention apparatus 4.

Figure 2A:
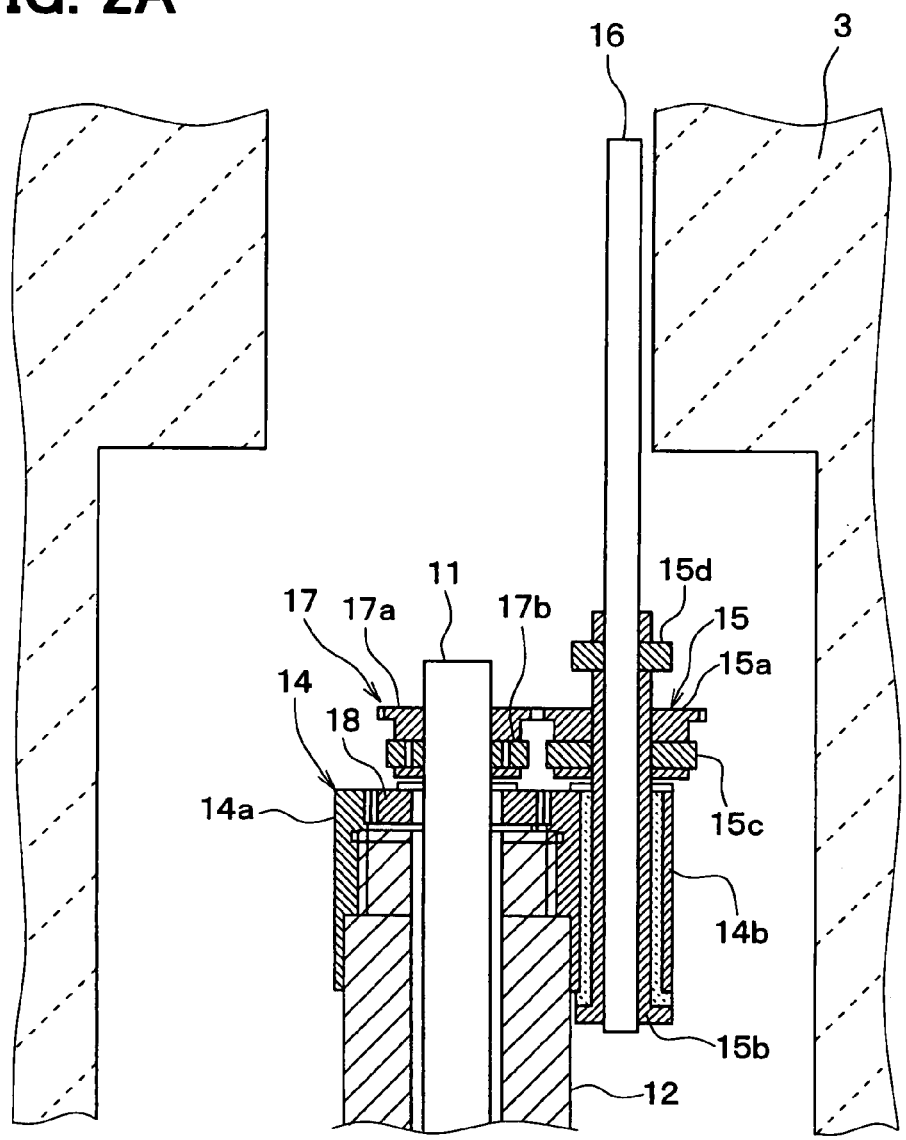
FIG. 2A is an enlarged view of a part of the SiC manufacturing device according to the first embodiment.
Figure 2B:
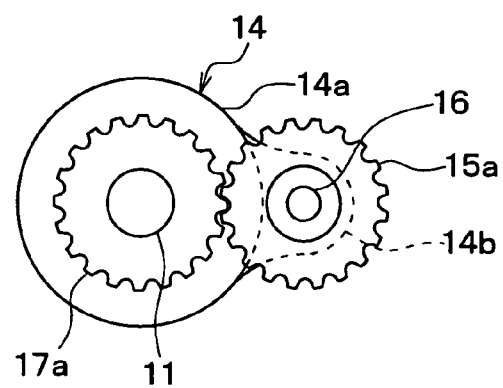
FIG. 2B is an enlarged view of a part of an attachment prevention apparatus.

The attachment prevention apparatus 4 includes a source-gas inducing pipe 11, a rotating shaft 12, a rotating element 13, a base plate 14, a first gearing system 15, a rod 16, and a second gearing system 17, as shown in FIGS. 1-2B.

The source-gas inducing pipe 11 has a cylindrical shape coaxially arranged with the gas-inducing pipe 3. The source-gas inducing pipe 11 is made of molybdenum (Mo), and the source gas includes a mixed gas of silane ($SiH_4$) and propane ($C_3H_8$), for example. The source gas is induced into the graphite crucible 1 through the source-gas inducing pipe 11.

The rotating shaft 12 has a cylindrical shape and is made of SUS, for example. An inside diameter of the rotation shaft 12 is longer than an outside diameter of the source-gas inducing pipe 11 by a predetermined length, and the source-gas inducing pipe 11 is inserted into the rotating shaft 12. The rotating shaft 12 rotates on its central axis when driven by the rotating element 13.

The rotating element 13 includes a motor 13a, a first bevel gear 13b and a second bevel gear 13c. The first bevel gear 13b is fixed to a rotation axis of the motor 13a to be rotatable. The second bevel gear 13c is fixed to a lower end of the rotating shaft 12, and engages with the first bevel gear 13b. Thereby, the rotating shaft 12 rotates when the motor 13a is driven, and a rotation number of the rotating shaft 12 is controlled by a rotation number of the motor 13a. Here, the two bevel gears 13b and 13c engage with each other, thereby the lower end of the rotation shaft 12 is opened. Thus, the source-gas inducing pipe 11 is inserted into the rotating shaft 12 from the open lower end.

The base plate 14 is a connecting member fixed to an upper end portion of the rotating shaft 12. The base plate 14 has a first cylindrical member 14a and a second cylindrical member 14b connected with each other. The first cylindrical member 14a has a hole, and the upper end portion of the rotating shaft 12 is screwed into the hole for fixing the first cylindrical member 14a. Thus, when the rotating shaft 12 rotates, the base plate 14 also rotates, thereby the second cylindrical member 14b revolves around the central axis of the rotating shaft 12 (i.e., a central axis of the first cylindrical member 14a).

A ring-shaped positioning member 18 is set at an upper end of the rotating shaft 12, and the source-gas inducing pipe 11 is inserted into a hole of the positioning member 18. An inside diameter of the positioning member 18 is slightly longer than an outside diameter of the source-gas inducing pipe 11. Thus, the source-gas inducing pipe 11 is positioned by the positioning member 18, thereby the source-gas inducing pipe 11 is restricted from leaning against the rotating shaft 12.

The first gearing system 15 is arranged at the second cylindrical member 14b to rotate on a central axis of the second cylindrical member 14b. The first gearing system 15 includes a gear 15a, a sleeve 15b, a first screw 15c for fixing the gear 15a, and a second screw 15d for fixing the rod 16.

The gear 15a is coaxially arranged with the central axis of the second cylindrical member 14b. The sleeve 15b is inserted into a hole of the gear 15a and is fixed by the first screw 15d. In addition, a lower part of the sleeve 15b is inserted into the second cylindrical member 14b to be rotatable. Furthermore, the rod 16 is inserted into the sleeve 15b, and is fixed by the second screw 15d. Thus, when the gear 15a rotates, the sleeve 15b and the rod 16 rotate on the central axis of the second cylindrical member 14b.

The rod 16 is made of a high-melting point material, which is stable in a temperature range between about 1000 and 2000° C. The high-melting point material may include a high-melting point metal such as molybdenum (Mo), tungsten (W), tantalum (Ta), zirconium (Zr), and niobium (Nb), a carbide ceramic such as SiC and a tantalum carbide (TaC), or a nitride ceramic such as boron nitride (BN). The rod 16 extends to a direction of a rotation axis of the gear 15a, and is arranged in a manner separated from the inner wall of the gas-inducing pipe 3 by a distance about in a range from 0 to 5 mm. Specifically, in a state where the rod 16 most approaches the inner wall of the gas-inducing pipe 3, a clearance between the rod 16 and the inner wall is about in the range from 0 to 5 mm.

The rod 16 may touch the inner wall of the gas-inducing pipe 3. In contrast, when the clearance is over 5 mm, the reactive deposit grows until filling the clearance. Thereby, when the reactive deposit is removed by the rod 16, a falling reactive deposit may be large and may affect the surface of the growing crystal. Therefore, the clearance between the rod 16 and the inner wall is set to be about in the range from 0 to 5 mm.

Here, the rod 16 has an approximately circular column shape or an approximately circular cylindrical shape having a diameter (outside diameter) about in a range from 1 to 20 mm, e.g., 5 mm. Thus, a distance from a rotation axis of the rod 16 to a portion of the rod 16, which most approaches the inner wall of the gas-inducing pipe 3, is about in a range from 0.5 to 10 mm. When the diameter of the rod 16 is under 1 mm, a rigidity of the rod 16 may be low. In contrast, when the diameter of the rod 16 is over 20 mm, the rod 16 may not remove the reactive deposit sufficiently, and may press the reactive deposit like a roller.

The second gearing system 17 is arranged at the upper end portion of the source-gas inducing pipe 11, more specifically, on an upper side of the positioning member 18. The second gearing system 17 has a gear 17a and a screw 17b for fixing the gear 17a. Specifically, the gear 17a is coaxially arranged with the source-gas inducing pipe 11, and the gear 17a is fixed to the source-gas inducing pipe 11 by the screw 17b so that the gear 17a cannot rotate.

Figure 3:
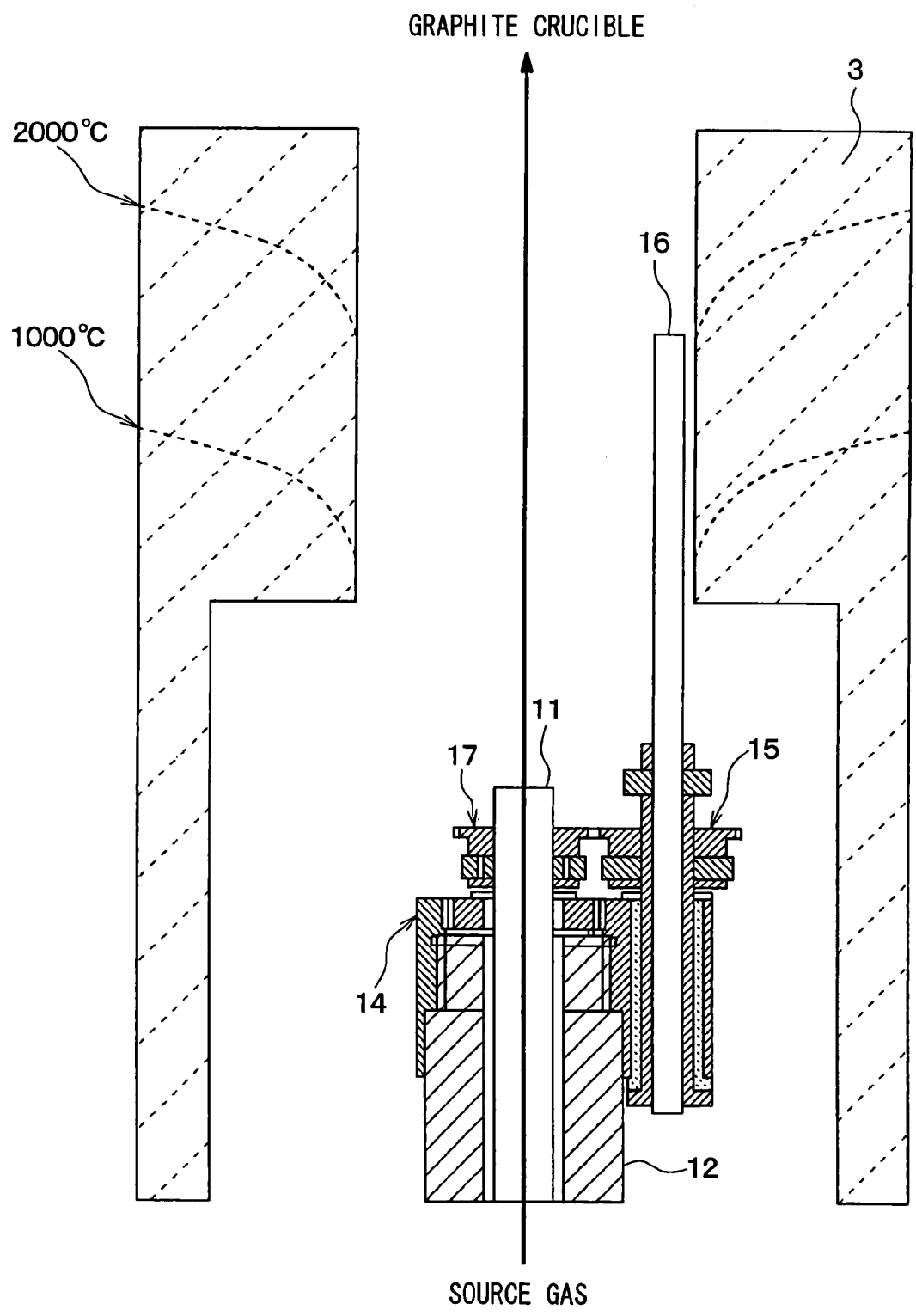
FIG. 3 is a schematic diagram showing a temperature distribution in the SiC manufacturing device according to the first embodiment.

The chamber 5 accommodates the graphite crucible 1 and the gas-inducing pipe 3. The induction coil 6 generates an induction current and heats in the chamber 5 to a predetermined temperature. Here, the induction coil 6 is controlled so that a surface temperature of the growing crystal in the graphite crucible 1 becomes about 2300° C. Thus, in the gas-inducing pipe 3 coupled with the graphite crucible 1, a portion adjacent to the graphite crucible 1 has a temperature about 2000° C., and a portion on an inlet side (i.e., upstream side of the flow direction of the source gas) has a temperature about 1000° C., as shown by the dotted lines in FIG. 3. The reactive deposit generates in a zone having the temperature range between about 1000 and 2000° C., thereby a length of the rod 16 is determined so that the rod 16 can cover the zone. However, when the rod 16 extends to a portion over 2000° C., the rod 16 may deform or melt due to a high temperature. Therefore, it is preferred that the length of the rod 16 is determined so that an upper end of the rod 16 reaches the portion at about 2000° C.

Next, a method of manufacturing a SiC single crystal using this SiC manufacturing device will be described.

At first, the seed crystal 9 is attached to the inner surface of the upper crucible part 7 of the graphite crucible 1. Then, the induction coil 6 is controlled so that the surface temperature of the seed crystal 9 becomes about 2300° C. Thereby, in the gas-inducing pipe 3, the portion on the inlet side has a temperature about 1000° C., and the portion adjacent to the graphite crucible 1 has a temperature about 2000° C.

Next, the source gas is induced through the source-gas inducing pipe 11. The source gas decomposes and reacts, thereby the SiC single crystal grows on the surface of the seed crystal 9. The upper crucible part 7 is lifted in accordance with a growing speed of the SiC single crystal using the lifting member 2, for keeping the temperature of the growing surface of the SiC single crystal about at 2300° C.

When the SiC single crystal grows, the motor 13a of the rotating element 13 is driven for rotating the rotating shaft 12 through the bevel gears 13b and 13c. The base plate 14 rotates with the rotation of the rotating shaft 12, thereby the first gearing system 15 held by the base plate 14 revolves around the central axis of the rotating shaft 12. The gear 15a of the first gearing system 15 engages with the gear 17a of the second gearing system 17 fixed to the source-gas inducing pipe 11, thereby the gear 15a of the first gearing system 15 rotates on the central axis of the second cylindrical member 14b. Thus, the sleeve 15b fixed to the gear 15a and the rod 16 fixed to the sleeve 15b also rotate on their rotation axes. In other words, the first gearing system 15 and the rod 16 revolve around the central axis of the rotating shaft 12 while rotating on their rotation axes.

As a result, the rotating rod 16 revolves constantly or intermittently in a manner separating from the inner wall of the gas-inducing pipe 3 by the distance about in the range from 0 to 5 mm during the crystal growth. Thereby, the reactive deposit is restricted from attaching to the inner wall, and even when the reactive deposit attaches to the inner wall, the rod 16 can remove the reactive deposit before having a thickness over the distance between the rod 16 and the inner wall.

A revolution speed of the rod 16 is controlled using the motor 13a of the rotating element 13, and may be about in a range from 1 to 100 rpm, e.g., about 15 rpm. When the revolution speed is under 1 rpm, the reactive deposit may attach to the rod 16, thereby the rod 16 may get thick and may be damaged. In contrast, when the revolution speed is over 100 rpm, the reactive deposit attached to the inner wall of the gas-inducing pipe 3 is rubbed hard, thereby particles of the reactive deposit may fly to the growing crystal, and may reduce the quality of the growing crystal.

A rotation speed of the rod 16 may be about in a range from 1 to 100 rpm, e.g., about 15 rpm, similarly with the revolution speed. When the rotation speed is under 1 rpm, the reactive deposit may attach to the rod 16, thereby the clearance between the rod 16 and the inner wall of the gas-inducing pipe 3 is filled with the reactive deposit, and the rod 16 may be damaged. In contrast, when the rotation speed is over 100 rpm, a friction between the rod 16 and the inner wall becomes large, thereby the rod 16 may be damaged by a little projection. Thus, it is preferred that the rod 16 removes the reactive deposit softly while restricting the reactive deposit from attaching to the rod 16.

In this SiC manufacturing device, the rod 16 made of the high-melting point material revolves at the position where the reactive deposit generates, from a beginning of the crystal growth. Therefore, the rod 16 drops off the reactive deposit before growing up or restricts the reactive deposit from growing. In addition, the rod 16 rotates on its axis from the beginning of the crystal growth, thereby the reactive deposit is restricted from attaching to the rod 16. Thus, the gas-inducing pipe 3 is prevented from being clogged with the reactive deposit, and the source gas can be induced for a long time, i.e., the SiC single crystal can grow to be long. Furthermore, this SiC manufacturing device restricts the removed reactive deposit from reducing the quality of the growing crystal.

Second Embodiment

Figure 4:
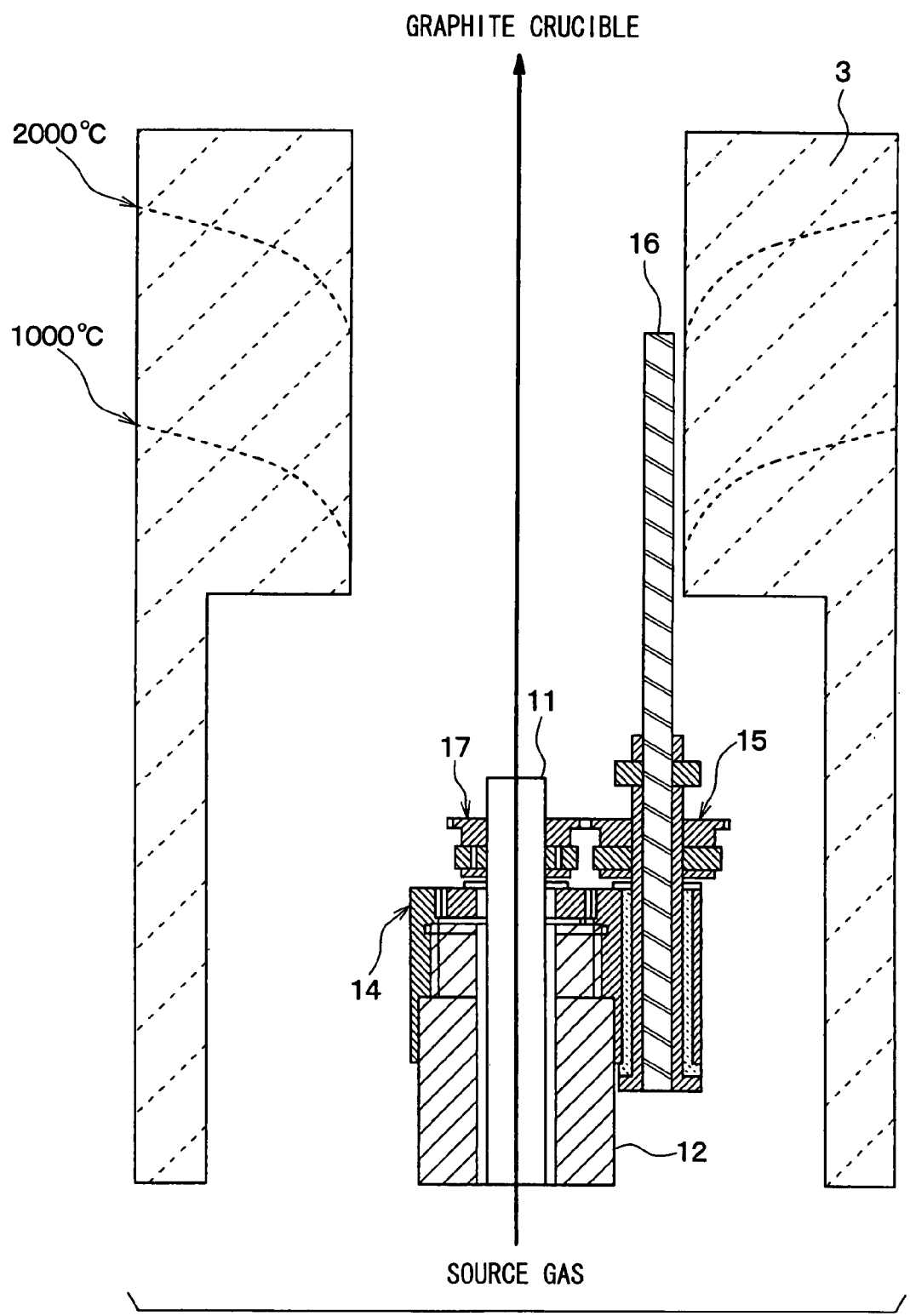
FIG. 4 is an enlarged view of a part of an attachment prevention apparatus in a SiC manufacturing device according to a second embodiment of the invention.

A rod 16 in FIG. 4 has a thread groove, thereby a reactive deposit removed by the rod 16 moves downward through the thread groove. Specifically, when the SiC single crystal grows and the rod 16 rotates on its axis, the reactive deposit getting in the thread groove moves downward due to a rotation of the rod 16 and a friction against the inner wall of the gas-inducing pipe 3. Thus, the reactive deposit can be removed certainly.

Third Embodiment

Figure 5:
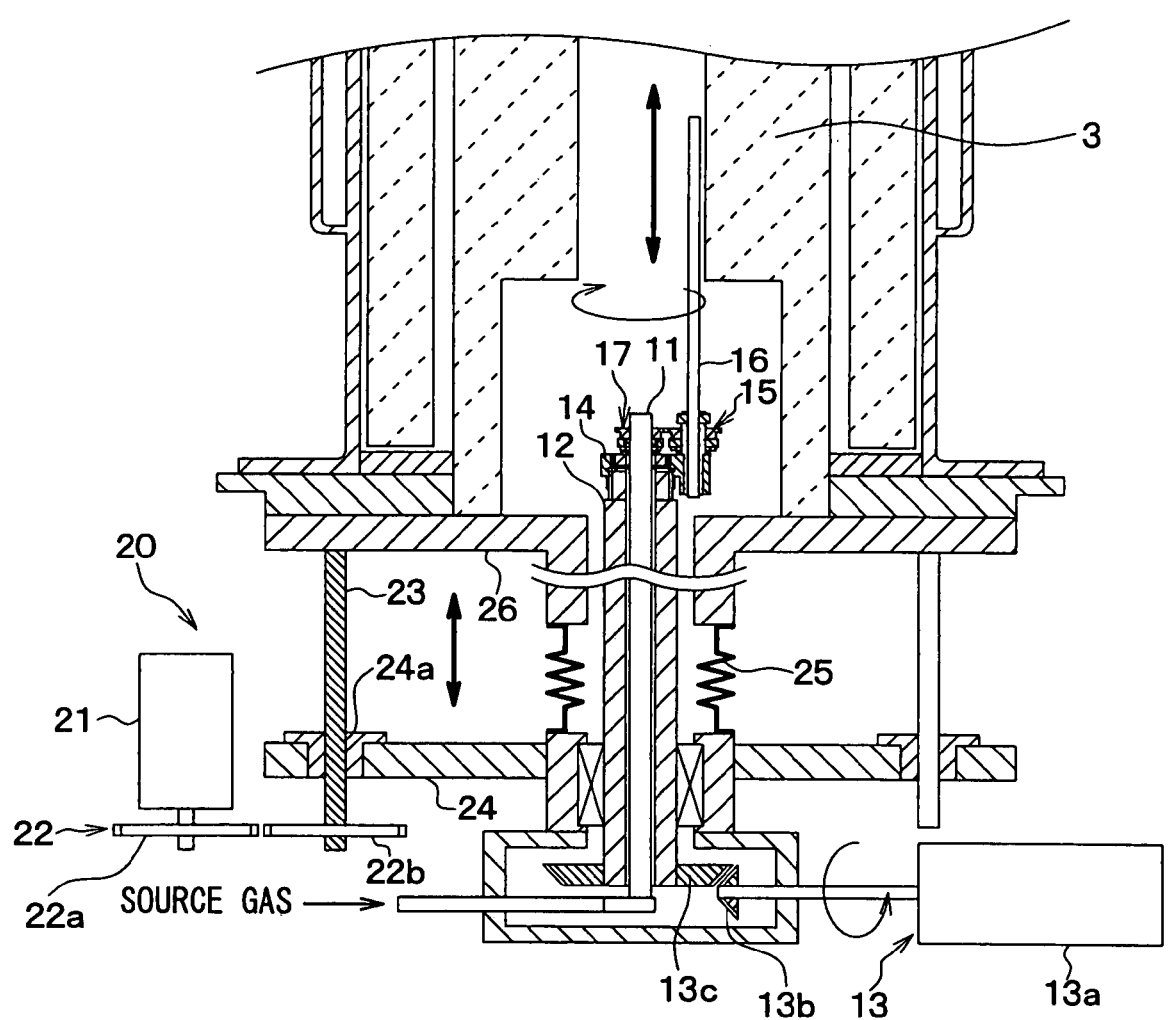
FIG. 5 is an enlarged view of an attachment prevention apparatus in a SiC manufacturing device according to a third embodiment of the invention.

An attachment prevention apparatus 4 in FIG. 5 includes a vertical moving element 20. The vertical moving element 20 includes a motor 21, a third gearing system 22, a driving screw 23, a movable plate 24, an expanding member 25, and a fixed plate 26.

The motor 21 is a driving source of the vertical moving element 20, and the attachment prevention apparatus 4 is moved up and down by rotating the motor 21. The third gearing system 22 includes a first gear 22a attached to a rotation axis of the motor 21, and a second gear 22b fixed to the driving screw 23. The first gear 22a and the second gear 22b engage with each other. Thus, when the motor 21 is driven and the rotation axis of the motor 21 rotates, the first gear 22a rotates, thereby the second gear 22b and the driving screw 23 also rotate.

The movable plate 24 has an internal thread hole 24a, and the driving screw 23 is screwed into the internal thread hole 24a. Thus, when the driving screw 23 rotates, the movable plate 24 moves vertically in accordance with a rotating direction of the driving screw 23. The fixed plate 26 and the movable plate 24 are coupled through the expanding member 25 having a bellows shape. Therefore, when the movable plate 24 moves vertically, the expanding member 25 absorbs a displacement, thereby the gas-inducing pipe 3 and the graphite crucible 1 fixed on an upper side of the fixed plate 26 stay at the same positions. As a result, the attachment prevention apparatus 4 and the rod 16 move vertically with respect to the gas-inducing pipe 3.

The rod 16 is vertically moved by the vertical moving element 20 and removes the reactive deposit within a zone in which the rod 16 moves. Thus, the rod 16 may be shorter than those in FIGS. 1-4. Specifically, a length of the rod 16 may be determined so that the rod 16 cover the zone having the temperature range between about 1000 and 2000° C. when the rod 16 is moved by the vertical moving element 20.

Figure 6:
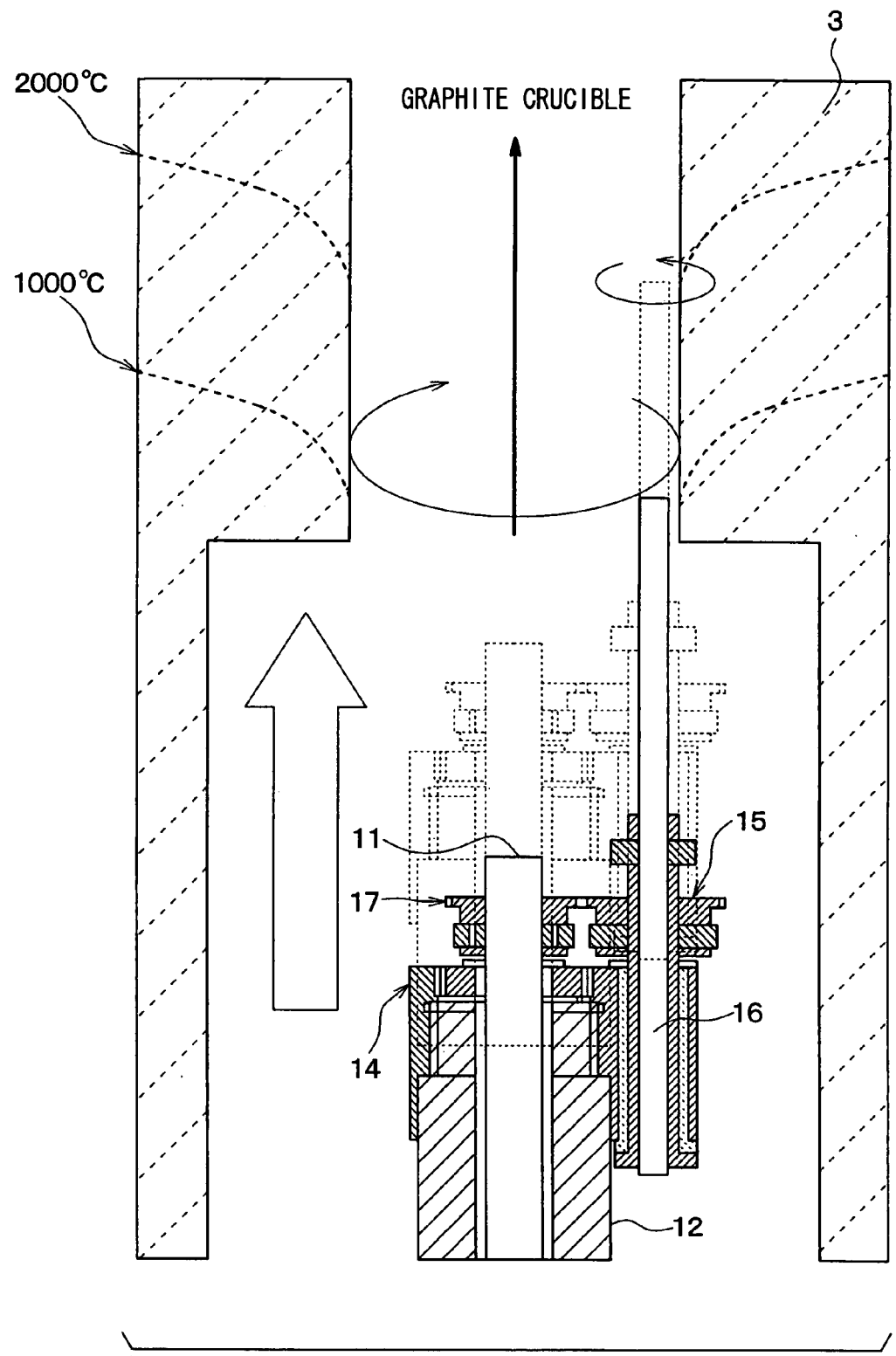
FIG. 6 is a schematic diagram showing a state where the attachment prevention apparatus is moved vertically.
Figure 7:
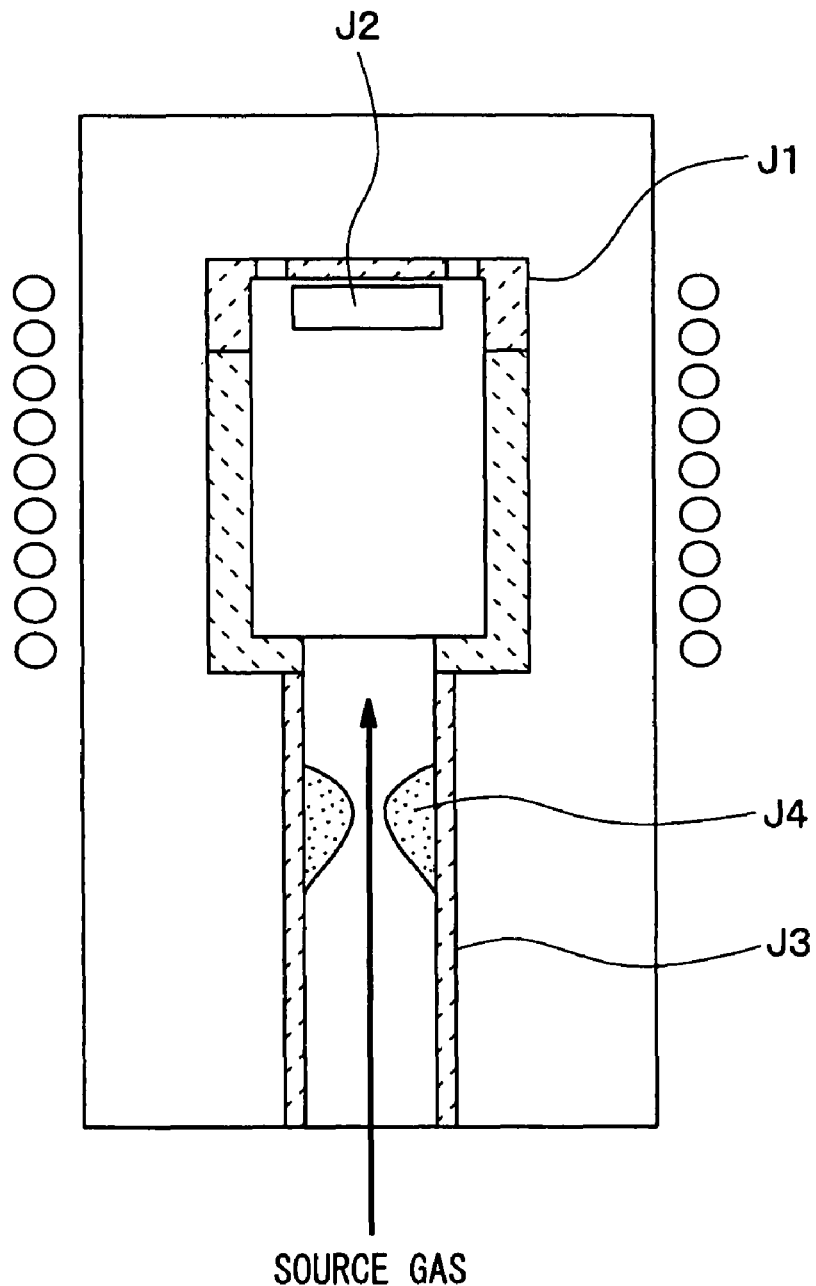
FIG. 7 is a schematic diagram showing a cross-sectional structure of a SiC manufacturing device according to a related art.

For example, the length of the rod 16 may be determined so that the upper end of the rod 16 reaches the portion at about 1000° C., when the rod 16 is moved to the most upstream side of the flow direction of the source gas by the vertical moving element 20. In this case, the vertical moving element 20 moves the rod 16 from a position where the upper end of the rod 16 reaches the portion at about 1000° C. to the position where the upper end of the rod 16 reaches the portion at about 2000° C., as shown in FIG. 6.

The rod 16 revolves and rotates about at 15 rpm, and moves vertically about in a range from 0 to 90 mm. The rod 16 moves vertically once about every 5 minutes at a speed about in a range from 0.1 to 10 mm/sec, e.g., at about 1 mm/sec. The rod 16 moves down as soon as the upper end of the rod 16 reaches the highest position (i.e., the portion at about 2000° C.).

When a speed of the vertical movement is under 0.1 mm/sec, the rod 16 may be damaged thermally at the highest position. In contrast, when the speed of the vertical movement is over 10 mm/sec, the rod 16 may be deformed or damaged due to an irregularity of the inner wall of the gas-inducing pipe 3.

A cycle of the vertical movement may be once about every 1 to 30 minutes. When the cycle is faster than once every 1 minute, the rod 16 moves constantly. Thus, a thermal loading at the upper end of the rod 16 and a stress adding to the rod 16 become almost the same level as those in FIGS. 1-4, and an advantage of moving the rod 16 is reduced. In contrast, when the cycle is later than once every 30 minutes, the reactive deposit attached to the inner wall of the gas-inducing pipe 3 becomes large. Thus, when the rod 16 moves vertically, a large amount of the reactive deposit falls and flies apart, and a part of the reactive deposit may fly to the growing crystal, thereby the quality of the SiC single crystal may be reduced.

As described above, in the SiC manufacturing device in FIG. 6, the rod 16 moves vertically with respect to the gas-inducing pipe 3, thereby the rod 16 can remove the reactive deposit within the zone in which the rod 16 moves. Thus, even when the rod 16 is shorter than those in FIGS. 1-4, the rod 16 can remove the reactive deposit in the zone having the temperature range between about 1000 and 2000° C.

Thereby, the rod 16 can be short, and the rigidity of the rod 16 can be improved. In addition, the reactive deposit can be removed effectively, by adding a vertical movement to the rod 16 in addition to the rotation and the revolution.

The rod 16 is made of the high-melting point material and is stable at about 2000° C. However, it is preferred to reduce a time when the rod 16 is subjected to a high temperature in view of a deformation and a melting of the upper end of the rod 16. In this SiC manufacturing device, the rod 16 is short and is moved vertically in the above-described cycle, thereby the time when the rod 16 is subjected to the high temperature can be reduced, and the deformation and the melting of the rod 16 can be restricted.

Other Embodiments

The rod 16 may have various cross-section shapes, such as an elliptical shape, a polygonal shape, and a star shape without being limited to a circular shape. In each case, a distance between the rod 16 and the inner wall of the gas-inducing pipe 3 is set to be about 5 mm or shorter, in a state where the rod 16 most approaches the inner wall.

The source gas is not limited to the mixed gas of the silane ($SiH_4$) and propane ($C_3H_8$), and may be another gas.

The rod 16 may include a plurality of rod members 16. In this case, each of the rod members is disposed around a central axis of the gas-inducing pipe, revolves along the inner wall of the gas-inducing pipe, and rotates on its axis in parallel to the flow direction.

Alternatively, the attachment prevention apparatus 4 may have a different structure with the above-described structures as long as it can revolve the rod 16 along the inner wall of the gas-inducing pipe 3 and rotate the rod 16 on its axis.

Such changes and modifications are to be understood as being within the scope of the present invention as defined by the appended claims.

What is claimed is:

1. A silicon carbide manufacturing device comprising:
   a graphite crucible, in which a seed crystal is disposed;
   a gas-inducing pipe coupled with the graphite crucible and having a column-shaped hollow part, through which a source gas flows into the graphite crucible; and
   an attachment prevention apparatus including a rod extending to a flow direction of the source gas, and a revolving and rotating element for revolving the rod along an inner wall of the gas-inducing pipe while rotating the rod on an axis of the rod in parallel to the flow direction, wherein
   the rod has a thread groove so that a reactive deposit getting in the thread groove moves from a downstream side to an upstream side of the flow direction by rotating the rod.

2. The silicon carbide manufacturing device according to claim 1, wherein:
   the rod is made of at least one of a high-melting point metal, a carbide ceramic, and a nitride ceramic.

3. The silicon carbide manufacturing device according to claim 1, wherein:
   the rod has a shape in which a distance from the axis to the farthest portion of a side wall of the rod is about in a range from 0.5 to 10 mm.

4. The silicon carbide manufacturing device according to claim 3, wherein:
   a clearance between the rod and the inner wall of the gas-inducing pipe is about in a range from 0 to 5 mm, in a state where the rod most approaches the inner wall.

5. The silicon carbide manufacturing device according to claim 1, wherein:
the rod includes a plurality of rod members; and
each of the rod members is disposed around a central axis of the gas-inducing pipe, revolves along the inner wall of the gas-inducing pipe, and rotates on an axis of each of the rod members in parallel to the flow direction.

6. The silicon carbide manufacturing device according to claim 1, wherein:
the gas-inducing pipe includes a zone having a temperature range between about 1000 and 2000° C.; and
the rod has a length to cover the zone of the gas-inducing pipe.

7. The silicon carbide manufacturing device according to claim 6, wherein:
the attachment prevention apparatus further includes a vertical moving element for vertically moving the rod; and
the length of the rod is determined to cover the zone in a state where the rod is vertically moved by the vertical moving element.

8. The silicon carbide manufacturing device according to claim 7, wherein:
the gas-inducing pipe has a first portion subject to a temperature about 1000° C.; and
the length of the rod is determined so that an upper end of the rod reaches the first portion, when the rod is moved to the most upstream side of the flow direction by the vertical moving element.

9. The silicon carbide manufacturing device according to claim 7, wherein:
the gas-inducing pipe has a second portion subjected to a temperature about 2000° C.; and
the vertical moving element moves the rod and the revolving and rotating element from a position where the upper end of the rod reaches the first portion to another position where upper end of the rod reaches the second portion.

10. The silicon carbide manufacturing device according to claim 7, wherein:
the vertical moving element moves the rod at a speed about in a range from 0.1 to 10 mm/sec.

11. The silicon carbide manufacturing device according to claim 7, wherein:
the vertical moving element moves the rod up and down once about every 1 to 30 minutes.

12. The silicon carbide manufacturing device according to claim 1, wherein:
the rod revolves along the inner wall of the gas-inducing pipe and rotates on the axis of the rod at speeds about in a range from 1 to 100 rpm, respectively.

13. A silicon carbide manufacturing device comprising:
a graphite crucible in which a seed crystal is disposed;
a gas-inducing pipe that is coupled with the graphite crucible and having a column-shaped hollow part, through which a source gas flows into the graphite crucible;
a source-gas inducing pipe that is coaxially arranged with the gas-inducing pipe;
a base plate that is coupled with the source-gas inducing pipe and that has a first cylindrical member and a second cylindrical member connected to each other;
a rotating shaft that is fixed to the first cylindrical member, that has the source-gas inducing pipe inside, that extends in a flow direction of the source gas, and that rotates around a central axis of the first cylindrical member; and
a rotating rod that is fixed to the second cylindrical member, that extends in the flow direction of the source gas, that is located between the rotating shaft and the gas-inducing pipe and that rotates around a central axis of the second cylindrical member, wherein
when the rotating shaft rotates, the second cylindrical member revolves around the central axis of the first cylindrical member so that the rotating rod revolves along an inner wall of the gas-inducing pipe while the rotating rod rotates itself.

14. The silicon carbide manufacturing device according to claim 13, wherein
the rod is made of at least one of a high-melting point metal, a carbide ceramic, and a nitride ceramic.

15. The silicon carbide manufacturing device according to claim 13, wherein
a distance between the rotating rod and the inner wall of the gas-inducing pipe is about in a range from 0 to 5 mm.

16. The silicon carbide manufacturing device according to claim 13, wherein
the rotating rod has a thread groove so that a reactive deposit in the thread groove moves from a downstream side to an upstream side of the flow direction by rotation of the rotating rod.

17. The silicon carbide manufacturing device according to claim 13, wherein
the rotating rod revolves along the inner wall of the gas-inducing pipe and rotates around the central axis of the second cylindrical member at speeds about in a range from 1 to 100 rpm, respectively.

* * * * *